US012713515B2

(12) United States Patent
Jin et al.

(10) Patent No.: US 12,713,515 B2
(45) Date of Patent: Aug. 18, 2026

(54) CONNECTOR

(71) Applicant: Suzhou MetaBrain Intelligent Technology Co., Ltd., Suzhou (CN)

(72) Inventors: Ran Jin, Suzhou (CN); Hao Yu, Suzhou (CN)

(73) Assignee: Suzhou MetaBrain Intelligent Technology Co., Ltd., Suzhou (CN)

( * ) Notice: Subject to any disclaimer, the term of this patent is extended or adjusted under 35 U.S.C. 154(b) by 0 days.

(21) Appl. No.: 19/136,951

(22) PCT Filed: Jan. 8, 2024

(86) PCT No.: PCT/CN2024/071062
§ 371 (c)(1),
(2) Date: Jun. 9, 2025

(87) PCT Pub. No.: WO2024/187933
PCT Pub. Date: Sep. 19, 2024

(65) Prior Publication Data

US 2026/0013031 A1 Jan. 8, 2026

(30) Foreign Application Priority Data

Mar. 13, 2023 (CN) ........................ 202310236137.6

(51) Int. Cl.
*H05K 1/02* (2006.01)

(52) U.S. Cl.
CPC ..... *H05K 1/0203* (2013.01); *H05K 2201/066* (2013.01); *H05K 2201/1059* (2013.01)

(58) Field of Classification Search
CPC ........... H05K 1/0203; H05K 2201/066; H05K 2201/1059

(Continued)

(56) References Cited

U.S. PATENT DOCUMENTS

2004/0262830 A1* 12/2004 Maeno .................. F16F 13/101
267/140.4
2020/0044387 A1* 2/2020 Chiang ................ H01R 13/627

FOREIGN PATENT DOCUMENTS

CN 106455321 A 2/2017
CN 107864569 A 3/2018
(Continued)

OTHER PUBLICATIONS

International Search Report of corresponding PCT application (PCT/CN2024/071062) Apr. 3, 2024, 6 pages.
(Continued)

*Primary Examiner* — Andargie M Aychillhum
(74) *Attorney, Agent, or Firm* — Cooper Legal Group, LLC

(57) ABSTRACT

Disclosed is a connector, which relates to the technical field of printed circuit sheets. The connector includes a fastener, a penetrating body, and connection assemblies. The fastener includes hole-wall fixing bodies and connecting bodies. The penetrating body includes a cylindrical portion and a pull rod. The connection assemblies are arranged between the fastener and the penetrating body. When the pull rod moves along a central axis to one side where an object to be fixed is arranged, an engaging member is driven to move to a position for engagement with each hole-wall fixing body; and additionally, at least two connection assemblies are also driven to press at least two hole-wall fixing bodies, so as to fix the at least two hole-wall fixing bodies to an inner side wall of a through hole.

20 Claims, 6 Drawing Sheets

(58) Field of Classification Search
USPC .......................................................... 361/748
See application file for complete search history.

(56) References Cited

FOREIGN PATENT DOCUMENTS

| | | | |
|---|---|---|---|
| CN | 108886874 | A | 11/2018 |
| CN | 109768399 | A | 5/2019 |
| CN | 210926389 | U | 7/2020 |
| CN | 113270742 | A | 8/2021 |
| CN | 116505303 | A | 7/2023 |
| JP | 2018195457 | A | 12/2018 |

OTHER PUBLICATIONS

Written Opinion of International Searching Authority of corresponding PCT application (PCT/CN2024/071062) Apr. 3, 2024, 6 pages.
First Office Action of corresponding CN priority application (CN202310236137.6) Aug. 1, 2023, 8 pages.
Notification to Grant Patent Right for Invention of corresponding CN priority application (CN202310236137.6) Aug. 28, 2023, 3 pages.

* cited by examiner (a)

(b)

CONNECTOR

CROSS-REFERENCE TO RELATED APPLICATION

This application claims priority to Chinese Patent Application No. 202310236137.6 filed on Mar. 13, 2023 in China National Intellectual Property Administration and entitled "Connector", which is hereby incorporated by reference in its entirety.

FIELD

The present application relates to the technical field of printed circuit boards, and particularly, to a connector.

BACKGROUND

With the development of consumer electronic products and data cloud technology, terminal electronic consumer products and servers have been applied in a wider range. Demands for products such as laptops, desktop computers, and servers continue to grow, leading to an increased shipment volume, which in turns drives a demand for boards. A board is a printed circuit board (PCB) that bears an electronic circuit for implementing one or more functions. Various components are assembled on the PCB, and part of them are fixed to the PCB through fasteners.

According to an existing mounting method, a fastener directly passes through a component to be fixed and a through hole of a PCB, to fix the component to the PCB. The fastener is generally made of plastic, and has an anchor-shaped top, as shown in FIG. 1. During mounting, as shown in FIG. 2, the top of the fastener generates recoverable deformation under the press of the through hole in order to pass through the through hole, as shown in (a) of FIG. 2; and after the fastener is in place, the top recovers its original shape, the anchor-shaped structure is supported on the surface of the PCB to fix the component, as shown in (b) of FIG. 2. During demounting, as shown in FIG. 3, the anchor-shaped structure on the top of the fastener is pressed to generate recoverable deformation, whereby the fastener passes through the through hole, as shown in (a) of FIG. 3; and the fastener is pulled out from the other surface of the PCB, as shown in (b) of FIG. 3.

During mounting or demounting of the fastener, the deformation of the fastener exerts a significant stress on an area around the through hole, which may cause localized deformation of the PCB around the through hole for demounting or mounting the fastener. However, due to the dense distribution of electronic components on the PCB, localized deformation is highly likely to cause damage or falling off of the components on the affected area, resulting in malfunction and even scrapping of the board. Therefore, a connector is needed urgently, and when a component is fixed to the PCB through the connector, mechanical stress borne around the through hole of the PCB is reduced, the localized deformation of the PCB near the through hole is reduced, and other components near the through hole are prevented from being damaged or falling off.

SUMMARY

In the prior art, components are fixed to a printed circuit board (PCB) by using fasteners, which may cause relatively great localized stress of the PCB near a through hole and impose a risk of deformation, resulting in damage or falling off of the components near the through hole. To solve the problem, the embodiment of the present application provides a connector. According to the connector, when a component which needs to be fixed by means of a PCB through hole and a mechanical structure is mounted to a PCB, stress borne around the through hole is reduced, the deformation of a local area of the PCB near the through hole due to stress is reduced, components near the through hole configured for mounting a mechanical fixing structure are prevented from being damaged or falling off due to the stress, and a PCB yield is improved by optimizing a connection structure. To solve the above-mentioned one or more technical problems, the present application adopts the following technical solution.

A connector is provided, configured to be mated with a through hole formed in a board to fix an object to be fixed on a surface of the board.

The connector includes a fastener, a penetrating body, and connection assemblies.

The fastener includes:

- at least two hole-wall fixing bodies, configured for fixing the fastener to an inner side wall of the through hole; and
- connecting bodies, configured for connecting adjacent hole-wall fixing bodies to enable an outer edge of the fastener to be mated with an inner edge of the through hole.

The penetrating body includes:

- a cylindrical portion, where a shape of an outer edge of a cross section of the cylindrical portion is mated with that of an inner edge of the fastener, the cylindrical portion has a central axis, and connection portion through holes are formed in a side wall of the cylindrical portion, and correspond to the at least two hole-wall fixing bodies;
- a pull rod, arranged along the central axis, where a first end portion of the pull rod is positioned on one side where the object to be fixed is arranged, and an engaging member is arranged on one side where a second end portion of the pull rod is configured; and
- at least two connection assemblies, where one side of each connection assembly is connected with one of the hole-wall fixing bodies, and the other side of each connection assembly is in contact with one of the connection portion through holes.

When the pull rod moves along the central axis to one side where the object to be fixed is arranged, the engaging member is driven to move to a position for engagement with each hole-wall fixing body; and additionally, the at least two connection assemblies are also driven to press the at least two hole-wall fixing bodies, so as to fix the at least two hole-wall fixing bodies to the inner side wall of the through hole.

Further, each hole-wall fixing body includes:

- a side wall, where the side wall is hollowed and arranged in parallel to the central axis;
- a first limiting layer, which is arranged on one side where the object to be fixed is arranged, and is connected with one end of the side wall; and
- a second limiting layer, which is connected with the other end of the side wall.

The first limiting layer and the second limiting layer are arranged in parallel, and a distance between the first limiting layer and the second limiting layer is mated with a thickness of the board.

Further, a distance from an outer edge endpoint of the first limiting layer to the central axis is greater than a radius of the through hole; and a distance from an outer edge endpoint of the second limiting layer to the central axis is less than the radius of the through hole.

Further, an included angle between the first limiting layer and the central axis is a preset angle; and an included angle between the second limiting layer and the central axis is a preset angle.

Further, the second limiting layer is hollowed, a telescopic body is arranged inside the second limiting layer, and a protrusion portion is arranged on one side, close to the central axis, of a second surface of the telescopic body; and a straight rail is arranged at a position where the second surface and the protrusion portion of the second limiting layer are mated, whereby the protrusion portion drives the telescopic body to slide along the straight rail.

Further, a lug is arranged on one side, close to the central axis, of a first surface of the telescopic body;

the lug is connected with a linear object, the linear object is connected with one end of a spring, and the other end of the spring is fixed to one end of the side wall; and the linear object is arranged in a first rail inside the side wall, and when the protrusion portion drives the telescopic body to slide along the straight rail, the linear object slides along the first rail.

Further, the first rail is formed by space defined by a first rail wall and a second rail wall, where the first rail wall is arranged on an opposite side of the lug.

Further, a plurality of lug limiting grooves are formed on a surface, opposite to the lug, of the first rail wall, and sizes of the lug limiting grooves are mated with that of the lug;

when the lug is engaged with the lug limiting grooves, relative positions of the telescopic body and the second limiting layer are fixed; and when the protrusion portion receives an acting force in a direction of the straight rail, the lug is disengaged from each lug limiting groove, whereby the telescopic body is driven by the protrusion portion to slide along the straight rail.

Further, the lug limiting grooves are at least formed at one end, close to the central axis, of the first rail wall, and one end, away from the central axis, of the first rail wall; and when the lug is engaged with the lug limiting groove far away from the central axis, a distance from an outer edge of the telescopic body to the central axis is greater than the radius of the through hole.

Further, an end portion structure is arranged at the second end portion of the pull rod, and is connected with the engaging member through a first connecting member;

the first connecting member is arranged in a second rail, and the second rail is formed by space defined by a third rail wall and a fourth rail wall; and when the pull rod moves along the central axis to one side where the object to be fixed is arranged, the first connecting member is driven by the end portion structure to move, along the second rail, in a direction away from the central axis, and drives the engaging member to move to the position for engagement with each hole-wall fixing body.

Further, a limiting protrusion portion is arranged on one side, close to the engaging member, of the first connecting member.

Further, along the second rail, a plurality of engaging member limiting grooves are formed at a position corresponding to the limiting protrusion portion;

when the limiting protrusion portion is engaged with each engaging member limiting groove, relative positions of the stopping member and the cylindrical portion are fixed; and when the pull rod receives an acting force in a direction of the central axis, the limiting protrusion portion is disengaged from each engaging member limiting groove, whereby the engaging member is driven by the first connecting member to slide along the second rail.

Further, the first connecting member is made of a flexible material.

Further, when a limiting lug is engaged with the engaging member limiting groove farthest from the central axis, a distance from an outer edge of the engaging member to the central axis is greater than the radius of the through hole; and when the limiting lug is engaged with the engaging member limiting groove closest to the central axis, a distance from the outer edge of the engaging member to the central axis is less than the radius of the through hole.

Further, the pull rod is also provided with the limiting lug;

a plurality of pull rod limiting grooves are formed on an inner side of the cylindrical portion corresponding to the limiting lug; and when the limiting lug is engaged with each pull rod limiting groove, relative positions of the pull rod and the cylindrical portion are fixed.

Further, each connection assembly includes:

a first connection portion, which is fixed to one side, close to the central axis, of the side wall of each hole-wall fixing body, a second connection portion, which is in contact with the side wall of the cylindrical portion, and at least two connecting strips for connecting the first connection portion and the second connection portion.

Further, at least two first connection fixing points are arranged on the first connection portion, and at least two second connection fixing points are arranged on the second connection portion; and each connecting strip connects one of the first connection fixing points and one of the second connection fixing points.

Further, the at least two connecting strips are arranged in parallel.

Further, each connection assembly further includes:

a slider, where one end of the slider has a limiting hollow area;

a fixing shaft is also arranged on the first connection portion, and passes through the limiting hollow area;

a slider through hole is formed at a position, corresponding to the slider, of the side wall, and the other end of the slider passes through the side wall through the slider through hole; and when the other end of the slider receives a force applied toward the central axis, the slider moves toward the central axis under coordinated action of the limiting hollow area and the fixing shaft.

Further, at least two crank arms are also arranged at one end of the slider, and cutting blades are arranged at tail ends of the crank arms;

V-shaped grooves are formed at positions, corresponding to the cutting blades, of the connecting strips, and cutting blade blocking portions are arranged on edges of the V-shaped grooves;

when the slider moves toward the central axis, the cutting blades move toward bottoms of the V-shaped grooves under the action of the cutting blade blocking portions; and when the hole-wall fixing bodies are connected with the inner side wall of the through hole, the cutting blades cut off the connecting strips at the bottoms of the V-shaped grooves.

Further, a connection portion through hole is formed at a position, corresponding to the second connection portion, of the side wall of the cylindrical portion;

a second connecting member is arranged at a position, corresponding to the second connection portion, of the pull rod, passes through the connection portion through hole along a third rail arranged in the hole-wall fixing bodies, and then is in contact with the second connection portion;

when the pull rod moves upwards, the second connecting member moves toward an outer side of the connection portion through hole along the second rail; and additionally, the second connecting member pushes the second connection portion to move away from the central axis.

Further, adhesive materials are adhered to surfaces, corresponding to the inner wall of the through hole, of the at least two hole-wall fixing bodies, and are configured for bonding the at least two hole-wall fixing bodies and the through hole.

The technical solution provided by the present application has the following beneficial effects:

1. when a component which needs to be fixed by means of a PCB through hole and a mechanical structure is mounted to a PCB, stress borne around the through hole is reduced;
2. the deformation of a local area of the PCB near the through hole due to stress is reduced;
3. the components near the through hole configured for mounting the mechanical fixing structure are prevented from being damaged or falling off due to the stress; and
4. a PCB yield is improved, thereby improving overall quality of electronic products.

BRIEF DESCRIPTION OF THE DRAWINGS

In order to describe the technical solutions in the embodiments of the present application more clearly, the drawings required to be used in the embodiments will be simply introduced below. It is apparent that the drawings described below are only some embodiments of the present application. Other drawings may further be obtained by those of ordinary skill in the art according to these drawings without creative work.

DETAILED DESCRIPTION

Figure 1:
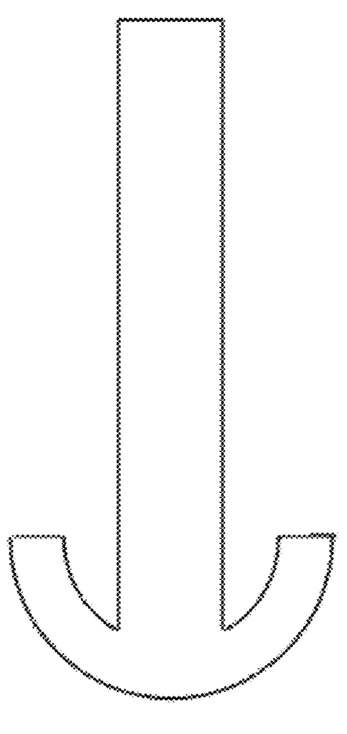
FIG. 1 is a schematic diagram of a fastener.
Figure 2:
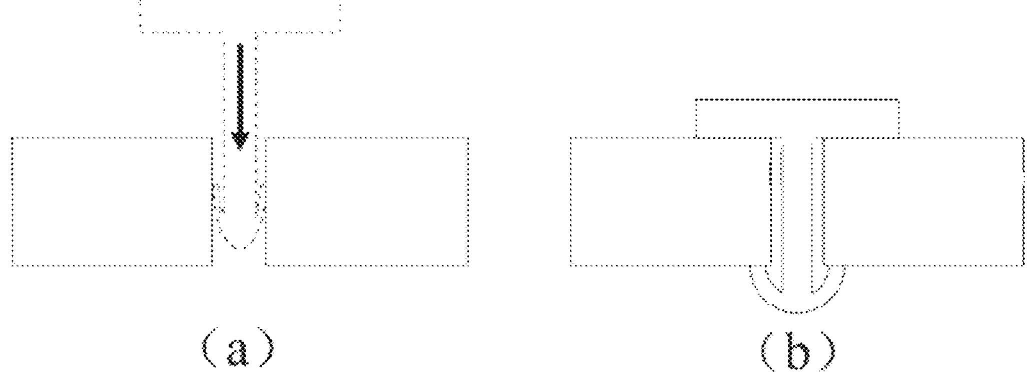
FIG. 2 is a schematic diagram of mounting a fastener.
Figure 3:
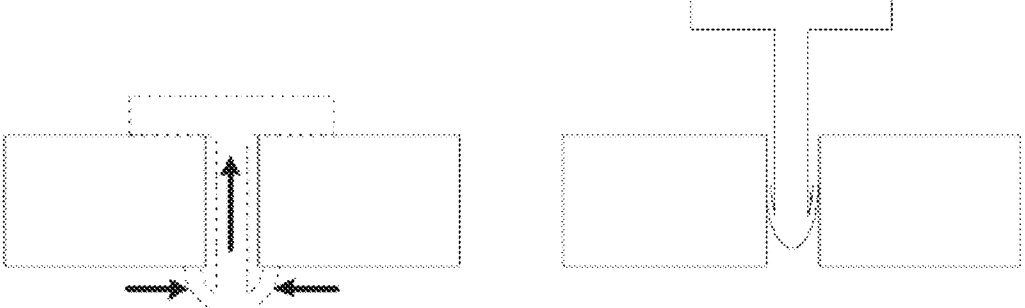
FIG. 3 is a schematic diagram of demounting a fastener.

To make objectives, technical solutions, and advantages of the present application more clear, the technical solutions in the present application will be clearly and completely described below with reference to the drawings in the present application. It is apparent that the described embodiments are not all embodiments but only part of the embodiments of the present application. All other embodiments obtained by those of ordinary skill in the art on the basis of the embodiments in the present application without creative work shall fall within the scope of protection of the present application.

Unless otherwise defined, technical terms or scientific terms used in the present application should have ordinary meanings understood by those of ordinary skill in the art to which the present application belongs. "First", "second", and other similar terms used in the present application do not indicate any sequence, quantity, or importance, but are only used for distinguishing different components. Similarly, "a", "one", "the", and other similar terms either do not indicate quantitative limitation, but indicate presence of at least one. The number in the drawings of the description is only for distinguishing various functional components or modules, but does not indicate logical relationships between the components or the modules. "Comprise", "include", and other similar terms mean that an element or article before the term covers elements or articles listed after the term or equivalents, but do not exclude other elements or articles. "Connect", "link", or other similar terms are not limited to physical or mechanical connection, but may include electrical connection, no matter direct connection or indirect connection. "Upper", "lower", "left", "right", etc. are only for indicating a relative positional relationship, and after an absolute position of a described object is changed, the relative positional relationship may also be changed accordingly.

Each embodiment of the present application will be described in detail below with reference to the drawings. It should be noted that in the drawings, a same drawing mark is assigned to components having substantially the same or similar structures and functions, and repeated descriptions thereof will be omitted.

In the prior art, components are fixed to a printed circuit board (PCB) by using fasteners, which may cause relatively great localized stress of the PCB near a through hole and impose a risk of deformation, resulting in damage or falling off of the components near the through hole. To solve the problem, the embodiment of the present application provides a connector. According to the connector, when a component which needs to be fixed by means of a PCB through hole and a mechanical structure is mounted to a PCB, stress borne around the through hole is reduced, the deformation of a local area of the PCB near the through hole due to stress is reduced, and components near the through hole configured for mounting a mechanical fixing structure are prevented from being damaged or falling off due to the stress. A PCB yield is improved by optimizing a connection structure.

In an embodiment, a connector is configured to be mated with a through hole formed in a board to fix an object to be fixed to a surface of the board. The board may be configured for indicating the PCB, the connector is mated with the through hole in the PCB, and a component such as a heat sink and a fan, is clamped on the surface of the PCB.

Figures 4, 5:
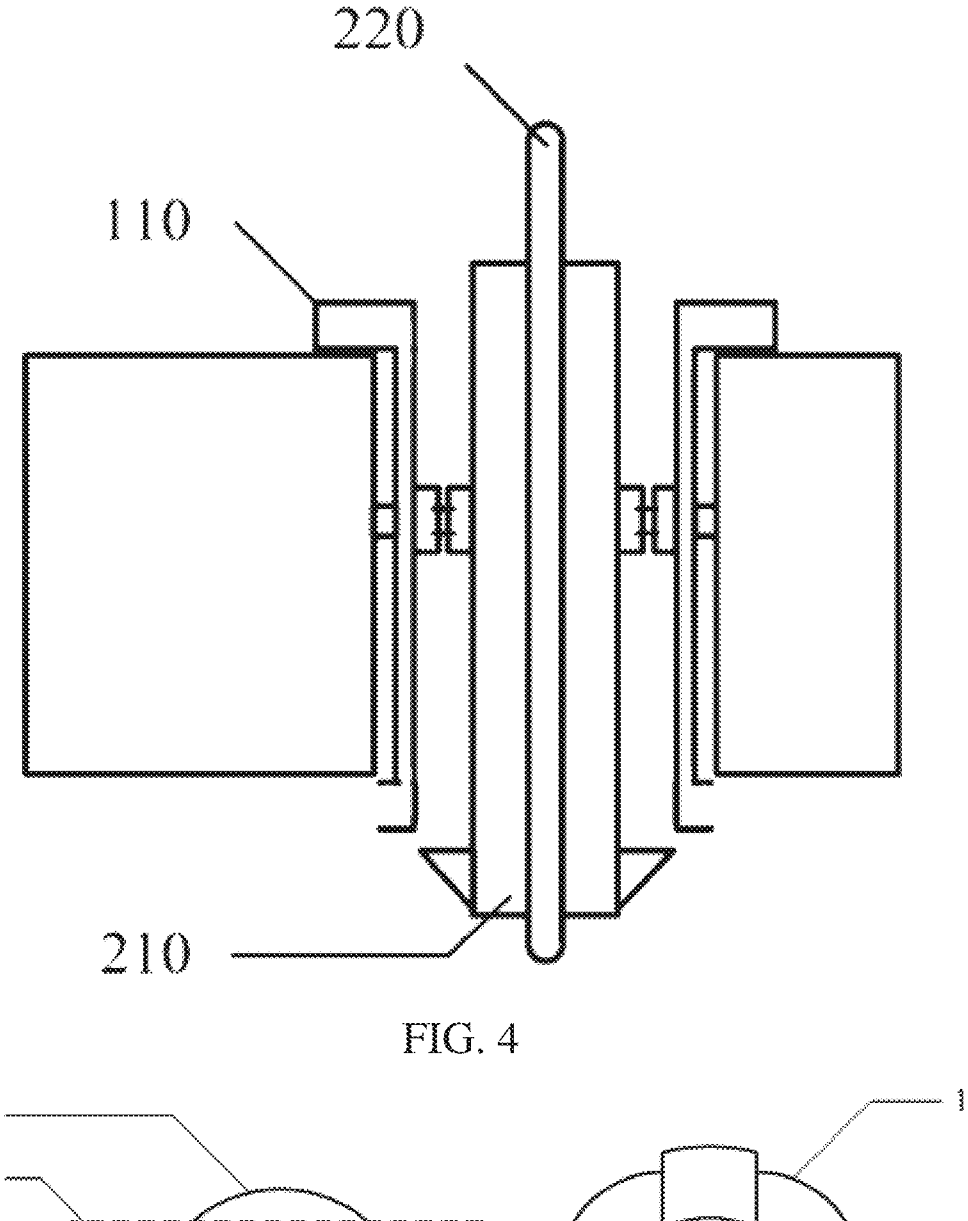
FIG. 4 is a schematic diagram of a connecting member according to an embodiment of the present application.
FIG. 5 is a schematic planar diagram of a hole-wall fixing body perpendicular to a central axis according to an embodiment of the present application.

The connector 1 includes a fastener 100, a penetrating body 200, and connection assemblies 300, and FIG. 4 and FIG. 5 show schematic planar diagrams of the connector 1 in a direction of a central axis AA'.

The fastener 100 includes at least two hole-wall fixing bodies 110 which are configured for fixing the fastener 100 to an inner side wall of the through hole, and connecting bodies 120 which are configured for connecting adjacent hole-wall fixing bodies 110 to enable an outer edge of the fastener 100 to be mated with an inner edge of the through hole.

The connecting bodies 120 connect the adjacent hole-wall fixing bodies 110 to form an edge profile of the fastener 100. The number of the hole-wall fixing bodies 110 is at least two, the edge profile may be in a circular shape as shown in (a) of FIG. 5, or a regular polygon as shown in (b) of FIG. 5, and when the number of the hole-wall fixing bodies 110 is more than two, the number of the hole-wall fixing bodies 110 is equal to the number of sides of the polygon, or when the number of the hole-wall fixing bodies 110 is more than two, the edge profile may be configured in a circular shape, which is not limited by the present application.

The penetrating body 200 includes:

a cylindrical portion 210, where a shape of an outer edge of a cross section of the cylindrical portion is mated with that of an inner edge of the fastener 100, the cylindrical portion 210 has the central axis AA', the cylindrical portion 210 has a particular thickness, and connection portion through holes (not shown) are formed in a side wall of the cylindrical portion 210, and correspond to the at least two hole-wall fixing bodies 110;

a pull rod 220 arranged along the central axis AA', where a first end portion of the pull rod 220 is positioned on one side where the object to be fixed is arranged, and an engaging member 2201 is arranged on one side where a second end portion of the pull rod 220 is configured; and at least two connection assemblies 300, where the number of the connection assemblies 300 is equal to that of the hole-wall fixing bodies 110, one side of each connection assembly 300 is connected with one of the hole-wall fixing bodies 110, and the other side of each connection assembly 300 is in contact with one of the connection portion through holes.

When the pull rod 220 moves along the central axis AA' to one side where the object to be fixed is arranged, the engaging member 2201 is driven to move to a position for engagement with each hole-wall fixing body 110; and additionally, the at least two connection assemblies 300 are also driven to press the at least two hole-wall fixing bodies 110, so as to fix the at least two hole-wall fixing bodies 110 to the inner side wall of the through hole.

Figure 6:
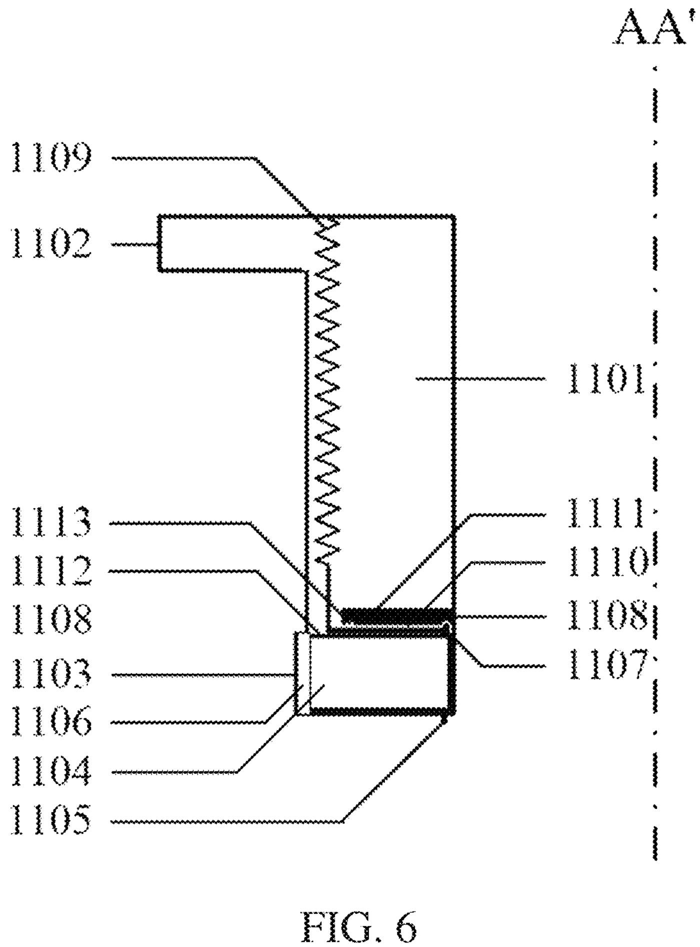
FIG. 6 is a sectional schematic diagram of a hole-wall fixing body according to an embodiment of the present application.

Each hole-wall fixing body 110 includes a side wall 1101, where the side wall 1101 is hollowed, and is arranged in parallel with the central axis AA', and FIG. 6 shows a sectional schematic diagram of a hole-wall fixing body 110 taken along a section passing through the central axis AA'.

A first limiting layer 1102 is arranged on one side where the object to be fixed is arranged, and is connected with one end of the side wall 1101; and a second limiting layer 1103 is connected with the other end of the side wall 1101.

The first limiting layer 1102 and the second limiting layer 1103 are arranged in parallel, and a distance between the first limiting layer 1102 and the second limiting layer 1103 is mated with a thickness of the board.

A distance from an outer edge endpoint of the first limiting layer 1102 to the central axis AA' is greater than a radius of the through hole; and a distance from an outer edge endpoint of the second limiting layer 1103 to the central axis AA' is less than the radius of the through hole.

An included angle between the first limiting layer 1102 and the central axis AA' is a preset angle, and generally is set to 90°; and an included angle between the second limiting layer 1103 and the central axis AA' is a preset angle, and generally is set to 90°.

The second limiting layer 1103 is hollowed, a telescopic body 1104 is arranged inside the second limiting layer 1103, and a protrusion portion 1105 is arranged on one side, close to the central axis AA', of a second surface of the telescopic body 1104; and a straight rail 1106 is arranged at a position, mated with the protrusion portion 1105, of a second surface of the second limiting layer 1103, whereby the protrusion portion 1105 drives the telescopic body 1104 to slide along the straight rail 1106.

A lug 1107 is arranged on one side, close to the central axis AA', of a first surface of the telescopic body 1104;

the lug 1107 is connected with a linear object 1108, the linear object 1108 is connected with one end of a spring 1109, and the other end of the spring 1109 is fixed to one end of the side wall 1101; and the linear object is arranged in a first rail 1110 inside the side wall 1101, and when the protrusion portion 1105 drives the telescopic body 1104 to slide along the straight rail 1106, the linear object 1108 slides along the first rail 1110.

The first rail 1110 is formed by space defined by a first rail wall 1111 and a second rail wall 1112, where the first rail wall 1111 is arranged on an opposite side of the lug 1107.

A plurality of lug limiting grooves 1113 are formed on a surface, opposite to the lug 1107, of the first rail wall 1111, and sizes of the lug limiting grooves 1113 are mated with that of the lug 1107;

when the lug 1107 is engaged with each lug limiting groove 1113, relative positions of the telescopic body 1104 and the second limiting layer 1103 are fixed; and when the protrusion portion 1105 receives an acting force in a direction of the straight rail 1106, the lug 1107 is disengaged from each lug limiting groove 1113, whereby the telescopic body 1104 is driven by the protrusion portion 1105 to slide along the straight rail 1106. When the hole-wall fixing bodies are mounted in place, the protrusion portion is pushed manually, and the telescopic body moves along the straight rail to one side away from the central axis, and extends out of the second limiting layer, whereby the hole-wall fixing bodies are fixed to the through hole of the PCB.

The lug limiting grooves 1113 are at least formed at one end, close to the central axis AA', of the first rail wall 1111, and one end, away from the central axis AA', of the first rail wall 1111; and when the lug 1107 is engaged with the lug limiting groove 1113 far away from the central axis AA', a distance from an outer edge of the telescopic body 1104 to the central axis AA' is greater than the radius of the through hole.

Figure 7:
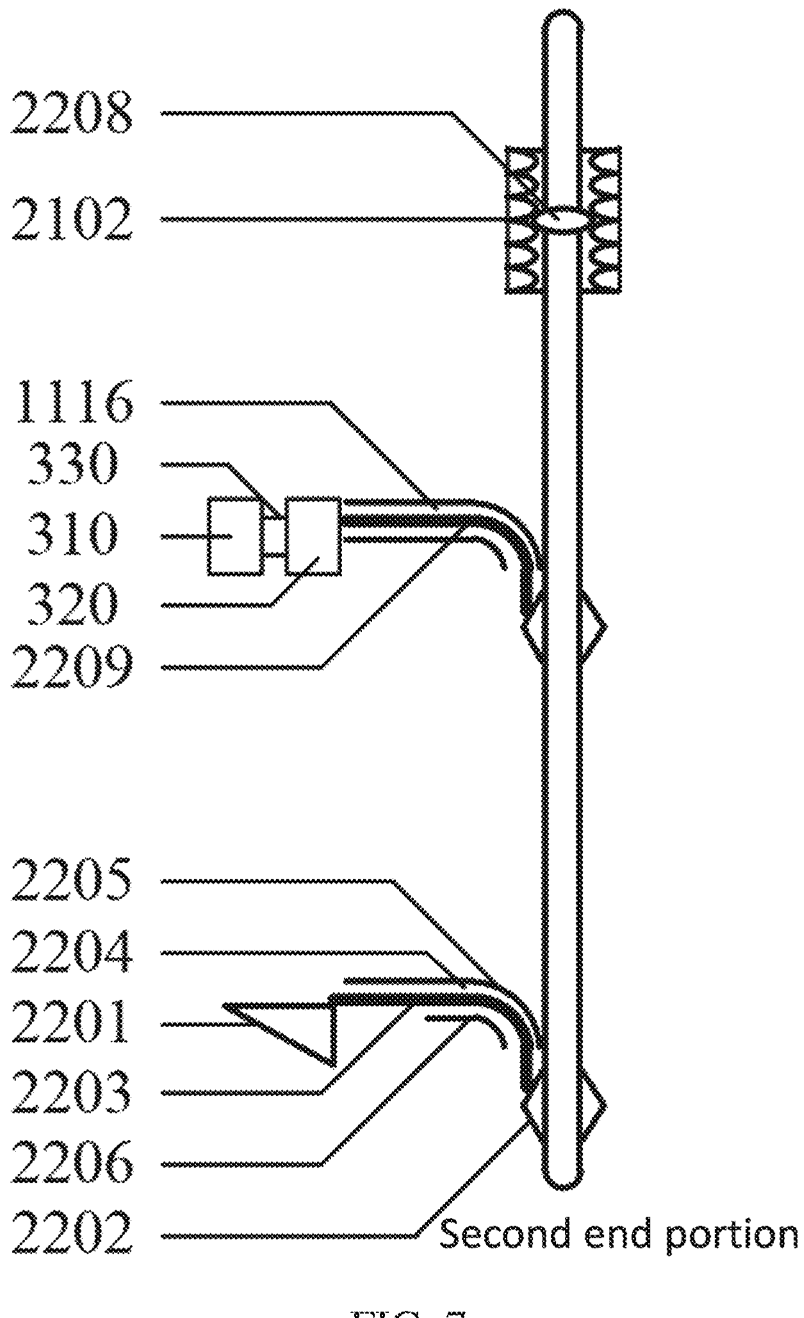
FIG. 7 is a schematic structural diagram of a pull rod according to an embodiment of the present application.

An end portion structure 2202 is arranged at the second end portion of the pull rod 220, and the end portion structure 2202 is connected with the engaging member 2201 through a first connecting member 2203, as shown in FIG. 7. A function of the end portion structure 2202 is to drive the first connecting member 2203 to move along with the pull rod 220, and a specific shape of the end portion structure 2202 is not limited by the present application.

The first connecting member 2203 is arranged in a second rail 2204, and the second rail 2204 is formed by space defined by a third rail wall 2205 and a fourth rail wall 2206; and when the pull rod 220 moves along the central axis AA' to one side where the object to be fixed is arranged, the first connecting member 2203 is driven by the end portion structure 2202 to move, along the second rail 2204, in a direction away from the central axis AA', and drives the engaging member 2201 to move to the position for engagement with each hole-wall fixing body 110.

A limiting protrusion portion 2207 is arranged on one side, close to the engaging member 2201, of the first connecting member 2203.

Along the second rail 2204, a plurality of engaging member limiting grooves 1114 are formed at a position corresponding to the limiting protrusion portion 2207;

when the limiting protrusion portion 2207 is engaged with each engaging member limiting groove 1114, relative positions of the engaging member 2201 and the cylindrical portion 210 are fixed; and when the pull rod 220 receives an acting force in a direction of the central axis, the limiting protrusion portion 2207 is disengaged from each engaging member limiting groove 1114, whereby the engaging member 2201 is driven by the first connecting member 2203 to slide along the second rail 2204.

The first connecting member 2203 is made of a flexible material.

When a limiting lug 2208 is engaged with the engaging member limiting groove 1114 farthest from the central axis AA', a distance from an outer edge of the engaging member 2201 to the central axis AA' is greater than the radius of the through hole; and when the limiting lug 2208 is engaged with the engaging member limiting groove 1114 closest to the central axis AA', a distance from the outer edge of the engaging member 2201 to the central axis AA' is less than the radius of the through hole.

Figure 8:
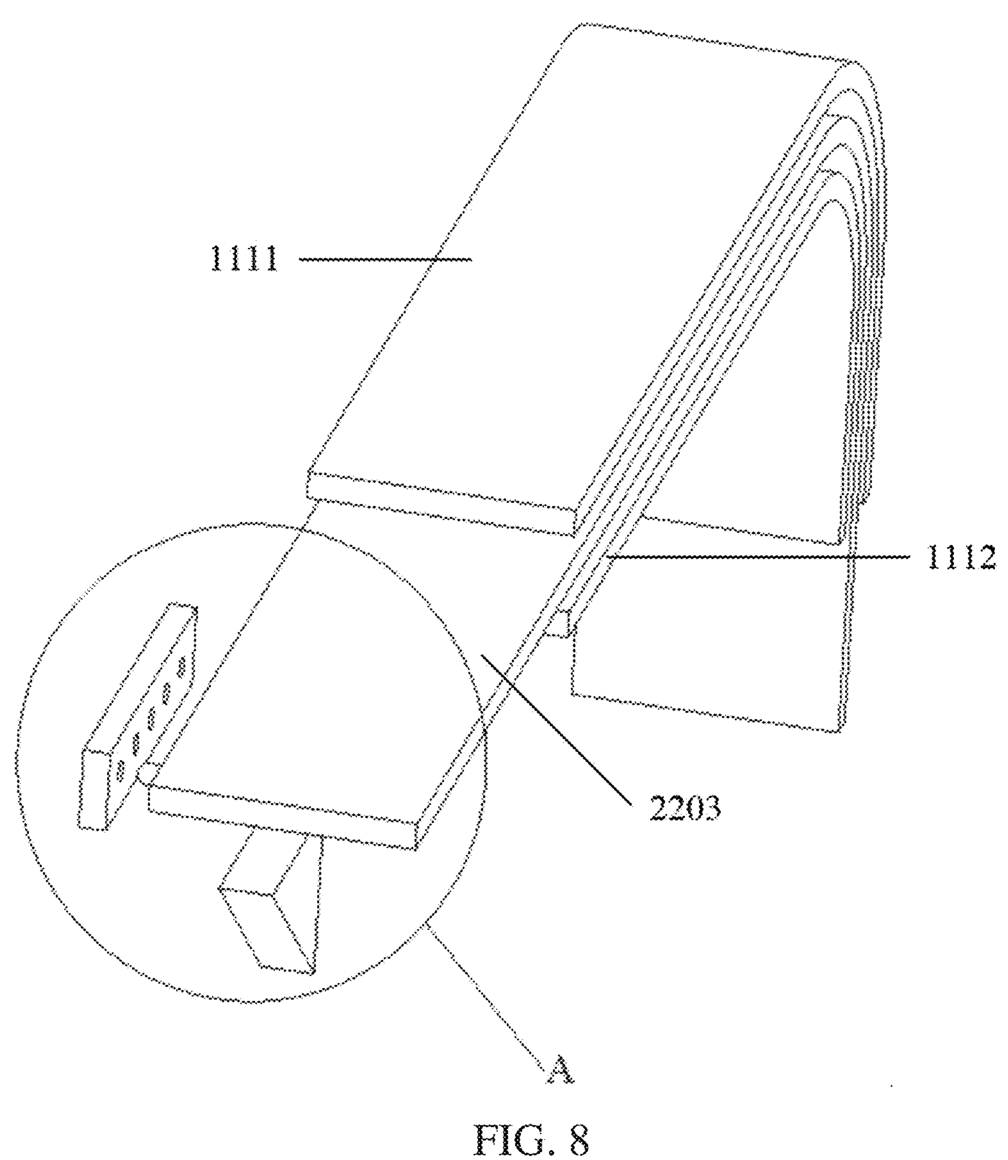
FIG. 8 is a schematic structural diagram of a limiting lug according to an embodiment of the present application.
Figures 9, 10:
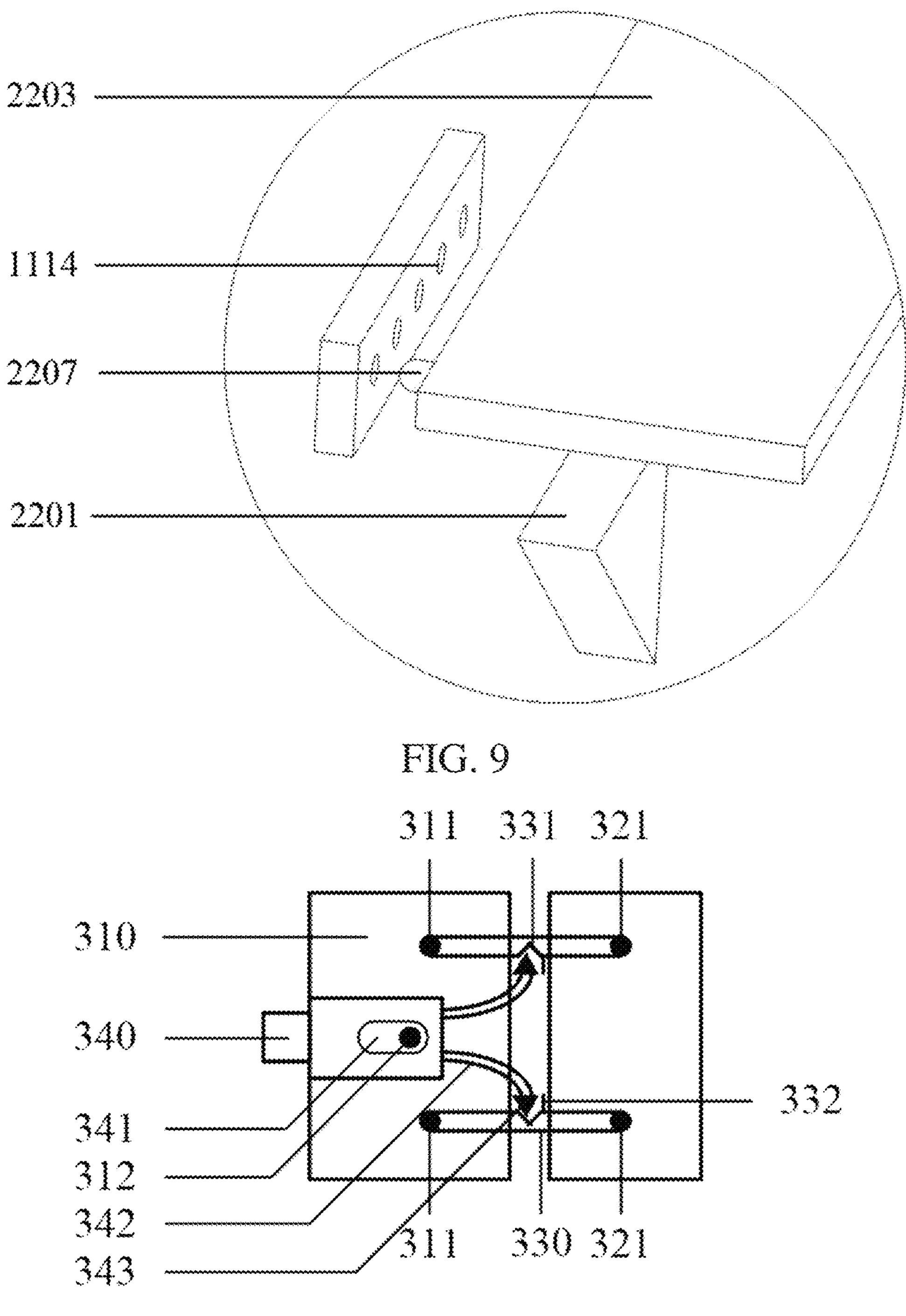
FIG. 9 is an enlarged schematic diagram of part A in FIG. 8.
FIG. 10 is a schematic diagram of a connection assembly according to an embodiment of the present application.

The pull rod 220 is also provided with the limiting lug 2208; and a plurality of pull rod limiting grooves 2102 are formed on an inner side of the cylindrical portion 210 corresponding to the limiting lug 2208, as shown in FIG. 8 and FIG. 9.

When the limiting lug 2208 is engaged with each pull rod limiting groove 2102, relative positions of the pull rod 220 and the cylindrical portion 210 are fixed.

Each connection assembly 300, as shown in FIG. 10, includes:

a first connection portion 310, which is fixed to one side, close to the central axis AA', of the side wall 1101 of each hole-wall fixing body 110;

a second connection portion 320, which is in contact with the side wall of the cylindrical portion 210; and at least two connecting strips 330 for connecting the first connection portion 310 and the second connection portion 320.

At least two first connection fixing points 311 are arranged on the first connection portion 310, and at least two second connection fixing points 321 are arranged on the second connection portion 320; and each connecting strip 330 connects one of the first connection fixing points 311 and one of the second connection fixing points 321.

The at least two connecting strips 330 are arranged in parallel.

Each connection assembly 300 further includes:

a slider 340, where one end of the slider 340 has a limiting hollow area 341.

A fixing shaft 312 is also arranged on the first connection portion 310, and the fixing shaft 312 passes through the limiting hollow area 341.

A slider through hole 1115 is formed at a position, corresponding to the slider 340, of the side wall 1101, and the other end of the slider 340 passes through the side wall 1101 through the slider through hole 1115; and when the other end of the slider 340 receives a force applied toward the central axis AA', the slider 340 moves toward the central axis AA' under coordinated action of the limiting hollow area 341 and the fixing shaft 312.

At least two crank arms 342 are also arranged at one end of the slider 340, and cutting blades 343 are arranged at tail ends of the crank arms 342;

V-shaped grooves 331 are formed at positions, corresponding to the cutting blades 343, of the connecting strips 330, and cutting blade blocking portions 332 are arranged on edges of the V-shaped grooves 331;

when the slider 340 moves toward the central axis AA', the cutting blades 343 move toward bottoms of the V-shaped grooves 331 under the action of the cutting blade blocking portions 332; and when the hole-wall fixing bodies 110 are connected with the inner side wall of the through hole, the cutting blades 343 cut off the connecting strips 330 at the bottoms of the V-shaped grooves 331.

A connection portion through hole is formed at a position, corresponding to the second connection portion 320, of the side wall of the cylindrical portion 210;

a second connecting member 2209 is arranged at a position, corresponding to the second connection portion 320, of the pull rod 220, the second connecting member 2209 passes through the connection portion through hole along a third rail 1116 arranged in the hole-wall fixing bodies 110, and then is in contact with the second connection portion 320; and the second connecting member 2209 is made of a flexible material.

When the pull rod 220 moves upwards, the second connecting member 2209 moves toward an outer side of the connection portion through hole along the second rail 1116; and additionally, the second connecting member 2209 pushes the second connection portion 320 to move away from the central axis.

Adhesive materials are adhered to surfaces, corresponding to the inner wall of the through hole, of the at least two hole-wall fixing bodies 110, and are configured for bonding the at least two hole-wall fixing bodies 110 and the through hole.

According to the connector disclosed by the embodiment of the present application, when the component which needs to be fixed by means of the PCB through hole and the mechanical structure is mounted to the PCB, stress borne around the through hole is reduced, the deformation of the local area of the PCB near the through hole due to stress is reduced, the components near the through hole configured for mounting the mechanical fixing structure are prevented from being damaged or falling off due to the stress, and the PCB yield is improved, thereby improving overall quality of electronic products.

All the above optional technical solutions may be randomly combined to form optional embodiments of the present application, which will not be described in detail herein.

Embodiment 1

A connector is configured to be mated with a through hole of a PCB to fix a heat sink to a surface of the PCB.

The connector 1 includes a fastener 100, a penetrating body 200, and connection assemblies 300, and FIG. 4 and FIG. 5 show schematic planar diagrams of the connector 1 in a direction of a central axis AA'.

The fastener 100 includes at least two hole-wall fixing bodies 110 which are configured for fixing the fastener 100 to an inner side wall of the through hole, and connecting bodies 120 which are configured for connecting adjacent hole-wall fixing bodies 110 to enable an outer edge of the fastener 100 to be mated with an inner edge of the through hole.

The connecting bodies 120 connect the adjacent hole-wall fixing bodies 110 to form an edge profile of the fastener 100. The number of the hole-wall fixing bodies 110 is at least two, and the edge profile may be in a circular shape as shown in (a) of FIG. 5.

The penetrating body 200 includes:

a cylindrical portion 210, where a shape of an outer edge of a cross section of the cylindrical portion is mated with that of an inner edge of the fastener 100, the cylindrical portion 210 has the central axis AA', the cylindrical portion 210 has a particular thickness, and connection portion through holes are formed in a side wall of the cylindrical portion 210, and correspond to the at least two hole-wall fixing bodies 110;

a pull rod 220 arranged along the central axis AA', where a first end portion of the pull rod 220 is positioned on one side where the object to be fixed is arranged, and an engaging member 2201 is arranged on one side where a second end portion of the pull rod 220 is configured; and at least two connection assemblies 300, where the number of the connection assemblies 300 is equal to that of the hole-wall fixing bodies 110, one side of each connection assembly 300 is connected with one of the hole-wall fixing bodies 110, and the other side of each connection assembly 300 is in contact with one of the connection portion through holes.

When the pull rod 220 moves along the central axis AA' to one side where the object to be fixed is arranged, the engaging member 2201 is driven to move to a position for engagement with each hole-wall fixing body 110; and additionally, the at least two connection assemblies 300 are also driven to press the at least two hole-wall fixing bodies 110, so as to fix the at least two hole-wall fixing bodies 110 to the inner side wall of the through hole.

Each hole-wall fixing body 110 includes a side wall 1101, where the side wall 1101 is hollowed, and is arranged in parallel with the central axis AA', and FIG. 6 shows a sectional schematic diagram of a hole-wall fixing body 110 taken along a section passing through the central axis AA'.

A first limiting layer 1102 is arranged on one side where the object to be fixed is arranged, and is connected with one end of the side wall 1101; and a second limiting layer 1103, which is connected with the other end of the side wall 1101.

The first limiting layer 1102 and the second limiting layer 1103 are arranged in parallel, and a distance between the first limiting layer 1102 and the second limiting layer 1103 is mated with a thickness of the board.

A distance from an outer edge endpoint of the first limiting layer 1102 to the central axis AA' is greater than a radius of the through hole; and a distance from an outer edge endpoint of the second limiting layer 1103 to the central axis AA' is less than the radius of the through hole.

An included angle between the first limiting layer 1102 and the central axis AA' is a preset angle, and is set to 90°; and an included angle between the second limiting layer 1103 and the central axis AA' is a preset angle, and is set to 90°.

The second limiting layer 1103 is hollowed, a telescopic body 1104 is arranged inside the second limiting layer 1103, and a protrusion portion 1105 is arranged on one side, close to the central axis AA', of a second surface of the telescopic body 1104; and a straight rail 1106 is arranged at a position, mated with the protrusion portion 1105, of a second surface of the second limiting layer 1103, whereby the protrusion portion 1105 drives the telescopic body 1104 to slide along the straight rail 1106.

A lug 1107 is arranged on one side, close to the central axis AA', of a first surface of the telescopic body 1104;

the lug 1107 is connected with a linear object 1108, the linear object 1108 is connected with one end of a spring 1109, and the other end of the spring 1109 is fixed to one end of the side wall 1101; and the linear object is arranged in a first rail 1110 inside the side wall 1101, and when the protrusion portion 1105 drives the telescopic body 1104 to slide along the straight rail 1106, the linear object 1108 slides along the first rail 1110.

The first rail 1110 is formed by space defined by a first rail wall 1111 and a second rail wall 1112, where the first rail wall 1111 is arranged on an opposite side of the lug 1107.

A plurality of lug limiting grooves 1113 are formed on a surface, opposite to the lug 1107, of the first rail wall 1111, and sizes of the lug limiting grooves 1113 are mated with that of the lug 1107;

when the lug 1107 is engaged with each lug limiting groove 1113, relative positions of the telescopic body 1104 and the second limiting layer 1103 are fixed; and when the protrusion portion 1105 receives an acting force in a direction of the straight rail 1106, the lug 1107 is disengaged from each lug limiting groove 1113, whereby the telescopic body 1104 is driven by the protrusion portion 1105 to slide along the straight rail 1106.

The lug limiting grooves 1113 are at least formed at one end, close to the central axis AA', of the first rail wall 1111, and one end, away from the central axis AA', of the first rail wall 1111; and when the lug 1107 is engaged with the lug limiting groove 1113 far away from the central axis AA', a distance from an outer edge of the telescopic body 1104 to the central axis AA' is greater than the radius of the through hole.

An end portion structure 2202 is arranged at the second end portion of the pull rod 220, and the end portion structure 2202 is connected with the engaging member 2201 through a first connecting member 2203, as shown in FIG. 7. A function of the end portion structure 2202 is to drive the first connecting member 2203 to move along with the pull rod 220, and a specific shape of the end portion structure 2202 is not limited by the present application.

The first connecting member 2203 is arranged in a second rail 2204, and the second rail 2204 is formed by space defined by a third rail wall 2205 and a fourth rail wall 2206; and when the pull rod 220 moves along the central axis AA' to one side where the object to be fixed is arranged, the first connecting member 2203 is driven by the end portion structure 2202 to move, along the second rail 2204, in a direction away from the central axis AA', and drives the engaging member 2201 to move to the position for engagement with each hole-wall fixing body 110.

A limiting protrusion portion 2207 is arranged on one side, close to the engaging member 2201, of the first connecting member 2203.

Along the second rail 2204, a plurality of engaging member limiting grooves 1114 are formed at a position corresponding to the limiting protrusion portion 2207;

when the limiting protrusion portion 2207 is engaged with each engaging member limiting groove 1114, relative positions of the engaging member 2201 and the cylindrical portion 210 are fixed; and when the pull rod 220 receives an acting force in a direction of the central axis, the limiting protrusion portion 2207 is disengaged from each engaging member limiting groove 1114, whereby the engaging member 2201 is driven by the first connecting member 2203 to slide along the second rail 2204.

The first connecting member 2203 is made of a flexible material.

When a limiting lug 2208 is engaged with the engaging member limiting groove 1114 farthest from the central axis AA', a distance from an outer edge of the engaging member 2201 to the central axis AA' is greater than the radius of the through hole; and when the limiting lug 2208 is engaged with the engaging member limiting groove 1114 closest to the central axis AA', a distance from the outer edge of the engaging member 2201 to the central axis AA' is less than the radius of the through hole.

The pull rod 220 is also provided with the limiting lug 2208; and a plurality of pull rod limiting grooves 2102 are formed on an inner side of the cylindrical portion 210 corresponding to the limiting lug 2208, as shown in FIG. 8 and FIG. 9.

When the limiting lug 2208 is engaged with each pull rod limiting groove 2102, relative positions of the pull rod 220 and the cylindrical portion 210 are fixed.

Each connection assembly 300, as shown in FIG. 10, includes:

a first connection portion 310, which is fixed to one side, close to the central axis AA', of the side wall 1101 of each hole-wall fixing body 110;

a second connection portion 320, which is in contact with the side wall of the cylindrical portion 210; and at least two connecting strips 330 for connecting the first connection portion 310 and the second connection portion 320.

At least two first connection fixing points 311 are arranged on the first connection portion 310, and at least two second connection fixing points 321 are arranged on the second connection portion 320; and each connecting strip 330 connects one of the first connection fixing points 311 and one of the second connection fixing points 321.

The at least two connecting strips 330 are arranged in parallel.

Each connection assembly 300 further includes:

a slider 340, where one end of the slider 340 has a limiting hollow area 341.

A fixing shaft 312 is also arranged on the first connection portion 310, and the fixing shaft 312 passes through the limiting hollow area 341;

a slider through hole 1115 is formed at a position, corresponding to the slider 340, of the side wall 1101, and the other end of the slider 340 passes through the side wall 1101 through the slider through hole 1115; and when the other end of the slider 340 receives a force applied toward the central axis AA', the slider 340 moves toward the central axis AA' under coordinated action of the limiting hollow area 341 and the fixing shaft 312.

At least two crank arms 342 are also arranged at one end of the slider 340, and cutting blades 343 are arranged at tail ends of the crank arms 342;

V-shaped grooves 331 are formed at positions, corresponding to the cutting blades 343, of the connecting strips 330, and cutting blade blocking portions 332 are arranged on edges of the V-shaped grooves 331;

when the slider 340 moves toward the central axis AA', the cutting blades 343 move toward bottoms of the V-shaped grooves 331 under the action of the cutting blade blocking portions 332; and when the hole-wall fixing bodies 110 are connected with the inner side wall of the through hole, the cutting blades 343 cut off the connecting strips 330 at the bottoms of the V-shaped grooves 331.

A connection portion through hole is formed in the side wall, corresponding to the second connection portion 320, of the cylindrical portion 210;

a second connecting member 2209 is arranged at a position, corresponding to the second connection portion 320, of the pull rod 220, the second connecting member 2209 passes through the connection portion through hole along a third rail 1116 arranged in the hole-wall fixing bodies 110, and then is in contact with the second connection portion 320; and the second connecting member 2209 is made of a flexible material.

When the pull rod 220 moves upwards, the second connecting member 2209 moves toward an outer side of the connection portion through hole along the second rail 1116; and additionally, the second connecting member 2209 pushes the second connection portion 320 to move away from the central axis.

Adhesive materials are adhered to surfaces, corresponding to the inner wall of the through hole, of the at least two hole-wall fixing bodies 110, and are configured for bonding the at least two hole-wall fixing bodies 110 and the through hole.

Embodiment 2

Mounting of a Connector:

When the connector is configured for fixing a heat sink to a PCB, a side provided with a limiting lug of a cylindrical portion is fixed with the heat sink. An operating mode for fixing the connector to the PCB is mainly described below.

A fastener passes through a through hole of the PCB, whereby a first limiting layer is in contact with one surface of the PCB. A protrusion portion is pushed away from a central axis manually, whereby a second limiting layer is in contact with the other surface of the PCB. At this moment, the fastener is fixed to the PCB.

A pull rod is moved toward one side where the heat sink is arranged, and the pull rod drives an engaging member to move away from the central axis, whereby the engaging member is clamped with hole-wall fixing bodies, and at this moment, the fastener is fixed to a penetrating body. Meanwhile, a second connecting member is driven to move away from the central axis, the second connecting member pushes a second connection portion to move away from the central axis, the second connection portion drives connection assemblies together with the hole-wall fixing bodies to move away from the central axis, and when the hole-wall fixing bodies are in contact with the through hole, adhesive materials on side faces of the hole-wall fixing bodies bond the hole-wall fixing bodies to a side wall of the through hole. The pull rod is moved continuously, and a slider moves toward the central axis, to push cutting blades to move toward V-shaped grooves under the action of blocking portions and finally cut off the V-shaped grooves, whereby the fastener is disconnected from the penetrating body. Because the fastener and the penetrating body are snap-fitted at this moment, the heat sink is fixed to a side surface of the PCB.

The fastener and the penetrating body are disconnected, whereby the penetrating body is convenient to replace.

Embodiment 3

Replacement of a Connector:

Because a fastener is fixed in a through hole, and during replacement, a penetrating body is only required to be replaced.

1. Removal of the penetrating body: a pull rod is pressed along a central axis toward one side where an engaging member is arranged, whereby the engaging member retracts toward the central axis; and the penetrating body is pulled out toward the heat sink, to be removed.

2. Replacement of a new penetrating body: the new penetrating body is inserted into the through hole in which the fastener is mounted, where on the new penetrating body, the heat sink is fixed to one side where a limiting lug is arranged. After the penetrating body is completely inserted, the pull rod is moved along the central axis toward one side where the heat sink is arranged, and the pull rod drives the engaging member to move away from the central axis, whereby the engaging member is snap-fitted with hole-wall fixing bodies, and the replacement of the penetrating body is completed.

Particularly, according to the embodiment of the present application, a process described in the above reference flow chart may be implemented as a computer software program. For example, the embodiment of the present application includes a computer program product. The computer program product includes a computer program loaded on a computer-readable medium, and the computer program includes program codes configured for executing a method shown in the flow chart. In such embodiment, the computer program may be downloaded through a communication device from the network and installed, or installed from a memory, or installed from a read only memory (ROM). When the computer program is executed by an external processor, the above functions defined by the method in the embodiment of the present application are executed.

It should be noted that the computer-readable medium in the embodiment of the present application may be a computer-readable signal medium, a computer-readable storage medium, or any combination thereof. The computer-readable storage medium, for example, may be, but not limited to, an electrical, magnetic, optical, electromagnetic, far-infrared, or semi-conductive system, device, or component, or any combination thereof. A more specific example of the computer-readable storage medium may include but not limited to an electrical connection having one or more wires, a portable computer disk, a hard disk, a random-access memory (RAM), an ROM, an erasable programmable read-only memory (EPROM or a flash memory), an optical fiber, a portable compact disc read-only memory (CD-ROM), an optical storage device, a magnetic storage device, or any proper combination thereof. In the embodiment of the present application, the computer-readable storage medium may be any tangible medium that contains or stores a program which may be used by or in conjunction with an instruction execution system, device, or component. However, in the embodiment of the present application, the computer-readable signal medium may include data signals which are transmitted in a baseband or as part of a carrier wave, and the data signals carry computer-readable program codes. Such transmitted data signals may be in various forms, and include but not limited to electromagnetic signals, optical signals, or any proper combination thereof. The computer-readable signal medium may also be any computer-readable medium except the computer-readable storage medium, and the computer-readable signal medium may send, transmit, or transfer a program used by or in conjunction with an instruction execution system, device, or component. The program codes contained on the computer-readable medium may be transmitted by using any proper medium, including but not limited to an electrical wire, an optical cable, radio frequency, etc., or any proper combination thereof.

The above computer-readable medium may be included in the above server, and may also exist independently and not be assembled in the server. The above computer-readable medium carries one or more programs which, when executed by the server, cause the server to: in response to detecting that a peripheral mode of a terminal is not activated, acquire a frame rate applied to the terminal; when the frame rate satisfies a screen-off condition, determine whether a user is acquiring screen information of the terminal; and in response to determining that the user does not acquire the screen information of the terminal, control a screen to enter an immediate dimming mode.

The computer program codes for executing operation of the embodiments of the present application may be written in one or more programming languages or combinations thereof, including object-oriented programming languages such as Java, Smalltalk, and C++, as well as conventional procedural programming languages such as "C" language or similar programming languages. The program codes may be completely executed on a user computer, partially executed on a user computer, executed as a standalone software package, partially executed on a user computer and partially executed on a remote computer, or completely executed on a remote computer or a server. In a situation involving the remote computer, the remote computer may be connected to the user computer through any type of network, including a local area network (LAN) or a wide area network (WAN), or may be connected to an external computer (for example, via the Internet from an Internet service provider).

Each embodiment in the description is described in a progressive manner, same or similar parts of the embodiments may be cross-referenced, and each embodiment primarily emphasizes aspects that differ from those of other embodiments. Particularly, for systems or system embodiments, because the systems or the system embodiments are similar to method embodiments, description is relatively brief, and relevant content may be referenced from the corresponding method embodiments. The above described systems and system embodiments are only indicative. The units described as separated components may be or may not be physically separated, and components shown as units may be or may not be physical units, that is, may be positioned at a place, or distributed on a plurality of network units. Part of or all modules may be selected according to an actual requirement to achieve an objective of the solution of the embodiment. Those of ordinary skill in the art may understand and implement the embodiments of the present application without creative work.

The above description provides a detailed explanation of technical solutions provided by the present application. The principle and implementations of the present application are elaborated with specific embodiments in the present application, and the descriptions made to the above embodiments are only intended to facilitate understanding of the methods and the core concept of the present application. Those of ordinary skill in the art may make variations to the specific implementations and the application scope based on the concept of the present application. Therefore, the content of the description should not be construed as limits to the present application.

The above descriptions are only preferred embodiments of the present application and not used for limiting the present application, and any modifications, equivalent replacements, improvements, and the like made within the spirit and principles of the present application should fall within the scope of protection of the present application.

What is claimed is:

1. A connector, configured to be used in conjunction with a through hole formed in a board to fix an object to be fixed to a surface of the board, wherein the connector comprises a fastener, a penetrating body, and at least two connection assemblies;

wherein the fastener comprises:

at least two hole-wall fixing bodies, configured for fixing the fastener to an inner side wall of the through hole, and connecting bodies, configured for connecting adjacent hole-wall fixing bodies to enable an outer edge of the fastener to be matched with an inner edge of the through hole; wherein the penetrating body comprises:

a cylindrical portion, wherein a shape of an outer edge of a cross section of the cylindrical portion matches with that of an inner edge of the fastener, the cylindrical portion has a central axis, and connection portion through holes are formed in a side wall of the cylindrical portion, and correspond to the at least two hole-wall fixing bodies; and a pull rod, arranged along the central axis, wherein a first end portion of the pull rod is positioned on a side where the object to be fixed is arranged, and an engaging member is arranged on one side where a second end portion of the pull rod is configured;

wherein one side of each connection assembly is connected with one of the hole-wall fixing bodies, and the other side of each connection assembly is in contact with one of the connection portion through holes; and when the pull rod moves along the central axis to the side where the object to be fixed is arranged the engaging member is driven to move to a position for engagement with each hole-wall fixing body, and the at least two connection assemblies are also driven to press the at least two hole-wall fixing bodies, so as to fix the at least two hole-wall fixing bodies to the inner side wall of the through hole.

2. The connector according to claim 1, wherein each of the at least two hole-wall fixing bodies comprises:

a hollow side wall, arranged in parallel to the central axis, a first limiting layer, arranged on the side where the object to be fixed is arranged, and connected with one end of the hollow side wall; and a second limiting layer, connected with a second end of the hollow side wall;

wherein the first limiting layer and the second limiting layer are arranged in parallel, and a distance between the first limiting layer and the second limiting layer matches with a thickness of the board.

3. The connector according to claim 2, wherein a distance from an outer edge endpoint of the first limiting layer to the central axis is greater than a radius of the through hole; and a distance from an outer edge endpoint of the second limiting layer to the central axis is less than the radius of the through hole.

4. The connector according to claim 2, wherein the second limiting layer is hollowed, a telescopic body is arranged inside the second limiting layer, and a protrusion portion is arranged on one side, close to the central axis, of a second surface of the telescopic body; and a straight rail is arranged at a position, matched with the protrusion portion, of a second surface of the second limiting layer, whereby the protrusion portion drives the telescopic body to slide along the straight rail.

5. The connector according to claim 4, wherein a lug is arranged on one side, close to the central axis, of a first surface of the telescopic body;

the lug is connected with a linear object, the linear object is connected with one end of a spring, and a second end of the spring is fixed to one end of the hollow side wall; and the linear object is arranged in a first rail inside the hollow side wall, and when the protrusion portion drives the telescopic body to slide along the straight rail, the linear object slides along the first rail.

6. The connector according to claim 5, wherein the first rail is formed by space defined by a first rail wall and a second rail wall, wherein the first rail wall is arranged on an opposite side of the lug.

7. The connector according to claim 6, wherein a plurality of lug limiting grooves are formed on a surface, opposite to the lug, of the first rail wall, and sizes of the plurality of lug limiting grooves match with that of the lug;

when the lug is engaged with each of the plurality of lug limiting grooves, relative positions of the telescopic body and the second limiting layer are fixed; and when the protrusion portion receives an acting force in a direction of the straight rail, the lug is disengaged from each of the plurality of lug limiting grooves, whereby the telescopic body is driven by the protrusion portion to slide along the straight rail.

8. The connector according to claim 7, wherein the plurality of lug limiting grooves are at least formed at one end, close to the central axis, of the first rail wall, and one end, away from the central axis, of the first rail wall; and when the lug is engaged with the one of the plurality of lug limiting grooves far away from the central axis, a distance from an outer edge of the telescopic body to the central axis is greater than a radius of the through hole.

9. The connector according to claim 1, wherein an end portion structure is arranged at the second end portion of the pull rod, and is connected with the engaging member through a first connecting member;

the first connecting member is arranged in a second rail, and the second rail is formed by space defined by a third rail wall and a fourth rail wall; and when the pull rod moves along the central axis to the side where the object to be fixed is arranged, the first connecting member is driven by the end portion structure to move, along the second rail, in a direction away from the central axis, and drives the engaging member to move to the position for engagement with each of the at least two hole-wall fixing bodies.

10. The connector according to claim 9, wherein a limiting protrusion portion is arranged on one side, close to the engaging member, of the first connecting member.

11. The connector according to claim 10, wherein along the second rail, a plurality of engaging member limiting grooves are formed at positions corresponding to the limiting protrusion portion;

when the limiting protrusion portion is engaged with each of the plurality of engaging member limiting grooves, relative positions of the engaging member and the cylindrical portion are fixed; and when the pull rod receives an acting force in a direction of the central axis, the limiting protrusion portion is disengaged from each of the plurality of engaging member limiting grooves, whereby the engaging member is driven by the first connecting member to slide along the second rail.

12. The connector according to claim 11, wherein the first connecting member is made of a flexible material.

13. The connector according to claim 9, wherein a limiting lug is arranged on the pull rod;

a plurality of pull rod limiting grooves are formed on an inner side of the cylindrical portion corresponding to the limiting lug; and when the limiting lug is engaged with each of the plurality of pull rod limiting grooves, relative positions of the pull rod and the cylindrical portion are fixed.

14. The connector according to claim 11, wherein when the limiting protrusion portion is engaged with one of the plurality of engaging member limiting grooves farthest from the central axis, a distance from an outer edge of the engaging member to the central axis is greater than a radius of the through hole; and when the limiting protrusion portion is engaged with a second one of the plurality of engaging member limiting grooves closest to the central axis, a distance from the outer edge of the engaging member to the central axis is less than the radius of the through hole.

15. The connector according to claim 1, wherein each of the at least two connection assemblies comprises:

a first connection portion, fixed to one side, close to the central axis, of a side wall of each of the at least two hole-wall fixing bodies;

a second connection portion, in contact with the side wall of the cylindrical portion; and at least two connecting strips for connecting the first connection portion and the second connection portion.

16. The connector according to claim 15, wherein at least two first connection fixing points are arranged on the first connection portion, and at least two second connection fixing points are arranged on the second connection portion; and each of the at least two connecting strips connects one of the at least two first connection fixing points and one of the at least two second connection fixing points.

17. The connector according to claim 15, wherein each connection assembly further comprises:

a slider, wherein one end of the slider has a limiting hollow area;

a fixing shaft is also arranged on the first connection portion, and passes through the limiting hollow area;

a slider through hole is formed at a position, corresponding to the slider, of the side wall of the hole-wall fixing body, and a second end of the slider passes through the side wall of the hole-wall fixing body through the slider through hole; and when the second end of the slider receives a force applied toward the central axis, the slider moves toward the central axis under coordinated action of the limiting hollow area and the fixing shaft.

18. The connector according to claim 17, wherein at least two crank arms are also arranged at the one end of the slider, and cutting blades are arranged at tail ends of the at least two crank arms;

V-shaped grooves are formed at positions, corresponding to the cutting blades, of the at least two connecting strips, and cutting blade blocking portions are arranged on edges of the V-shaped grooves; and when the slider moves toward the central axis, the cutting blades move toward bottoms of the V-shaped grooves under an action of the cutting blade blocking portions; and when the at least two hole-wall fixing bodies are connected with the inner side wall of the through hole, the cutting blades cut off the at least two connecting strips at the bottoms of the V-shaped grooves.

19. The connector according to claim 17, wherein a connection portion through hole is formed on the side wall, corresponding to the second connection portion, of the cylindrical portion;

a second connecting member is arranged at a position, corresponding to the second connection portion, of the pull rod, passes through the connection portion through hole along a third rail arranged in the at least two hole-wall fixing bodies, and then is in contact with the second connection portion; and when the pull rod moves upwards, the second connecting member moves toward an outer side of the connection portion through hole along the third rail; and the second connecting member pushes the second connection portion to move away from the central axis.

20. The connector according to claim 1, wherein adhesive materials are adhered to surfaces, corresponding to the inner side wall of the through hole, of the at least two hole-wall fixing bodies, and are configured for bonding the at least two hole-wall fixing bodies and the through hole.

* * * * *